US008436755B2

(12) United States Patent
Korodi et al.

(10) Patent No.: US 8,436,755 B2
(45) Date of Patent: May 7, 2013

(54) METHODS AND DEVICES FOR REDUCING SOURCES IN BINARY ENTROPY CODING AND DECODING

(75) Inventors: Gergely Ferenc Korodi, Waterloo (CA); Dake He, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 96 days.

(21) Appl. No.: 13/112,597

(22) Filed: May 20, 2011

(65) Prior Publication Data

US 2011/0285557 A1 Nov. 24, 2011

Related U.S. Application Data

(60) Provisional application No. 61/347,027, filed on May 21, 2010.

(51) Int. Cl.
*H03M 7/00* (2006.01)
(52) U.S. Cl.
USPC ............................................. 341/107; 341/65
(58) Field of Classification Search .................. 341/50, 341/67, 107, 65
See application file for complete search history.

(56) References Cited

U.S. PATENT DOCUMENTS

| 5,381,145 | A | 1/1995 | Allen et al. | |
| 7,928,868 | B1 * | 4/2011 | Huang et al. | 341/107 |
| 7,948,408 | B2 * | 5/2011 | Xu | 341/107 |
| 8,243,816 | B2 * | 8/2012 | Tung et al. | 375/240.23 |
| 2005/0012648 | A1 | 1/2005 | Marpe et al. | |
| 2009/0279613 | A1 | 11/2009 | Suzumura | |

FOREIGN PATENT DOCUMENTS

| WO | WO2007/066121 | 6/2007 |
| WO | WO2008/053755 | 5/2008 |
| WO | WO2009/157043 | 12/2009 |
| WO | WO2010/091505 | 8/2010 |

OTHER PUBLICATIONS

Boliek Metal: "Very high speed entropy coding" Proceedings of the International Conference on Image Processing (ICIP) Austin, Nov. 13-16, 1994; [Proceedings of the International Conference on Image Processing (ICIP)], Los Alamitos, IEEE Comp. Soc. Press, US LNKD DOI:10.1109/ICIP.1994.413814, vol. 3, Nov. 13, 1994, pp. 625-629, XP010146390.

Mastronarde N H et al: "A Bargaining Theoretic Approach to Quality-Fair System Resource Allocation for Multiple Decoding Tasks" IEEE Tran5actions on Circuits and Systems for Video Technology, IEEE Service Center, Piscataway, NJ, US, vol. 18, No. 4, Apr. 1, 2008, pp. 453-466, XP011204010.

(Continued)

*Primary Examiner* — Brian Young
(74) *Attorney, Agent, or Firm* — Rowand LLP (57) ABSTRACT

Methods and systems are described for combining sources in a data compression system. In a system in which a context model results in the production of multiple sources or symbols, each source being associated with a probability estimate, sources may be combined by defining another, reduced size, set of probabilities. The new set of probabilities may be a subset of the predefined set of probabilities provided by the context model. Minimizing relative entropy may be a basis upon which to define a mapping of predefined probabilities to the new set of probabilities. An input sequence that was modeled using the context model may then be entropy encoded and entropy decoded using the new set of probabilities based on a mapping between the new probabilities and the predefined probabilities.

28 Claims, 7 Drawing Sheets

OTHER PUBLICATIONS

European Search Report dated Aug. 12, 2010.

Vivienne Sze, Anantha P. Chandrakasan, Madhukar Budagavi, Minhua Zhou: Parallel CABAC for low power video coding. ICIP 2008: 2096-2099. Available under http://www-video.eecs.berkeley.edu/Proceedings/ICIP2008/pdfs/0002096.pdf.

Chung-Hyo Kim and In-Cheol Park, "Parallel Decoding of Context-based Adaptive Binary Arithmetic Codes Based on Most Probable Symbol Prediction", IEICE Trans. Inf. & Syst., Voi.E90?D, No. 2 Feb. 2007. p. 609. Available under http://ics.kaist.ac.kr/ver3.0/intjpapers/Parallei%20Decoding%20of%20Context-based%20Adaptive%20Binary%20Arithmetic%20Codes%20-Based%Based%20on%20Most%Probable%20Symboi%20-Prediction.pdf.

ITU-T Recommendation H.264/ISOIIEC 14496-10 AVC, Advanced video coding for general audiovisual services, Nov. 2007.

H.264/AVC reference software, available online http://iphome.hhi.de/surhring/trnll.

International Search Report, Application No. PCT/CA2011/050034.

International Search Report dated Aug. 4, 2011, PCT/CA2011/050318.

\* cited by examiner

METHODS AND DEVICES FOR REDUCING SOURCES IN BINARY ENTROPY CODING AND DECODING

CROSS-REFERENCE TO RELATED APPLICATIONS

The present application claims priority to U.S. provisional application Ser. No. 61/347,027 filed May 21, 2010, the contents of which are hereby incorporated by reference.

FIELD

The present application generally relates to data compression and, in particular, to an encoder, a decoder and methods for reducing sources in binary entropy coding and decoding.

BACKGROUND

A number of coding schemes have been developed to encode binary data. For example, JPEG images may be encoded using Huffman codes. The H.264 standard allows for two possible entropy coding processes: Context Adaptive Variable Length Coding (CAVLC) or Context Adaptive Binary Arithmetic Coding (CABAC). CABAC results in greater compression than CAVLC, but CABAC is more computationally demanding.

Recent advances in binary entropy coding have made it increasingly attractive as an encoding scheme. For example, it is possible to engage in parallel encoding, where a source input sequence is separated into parallel subsequences based on context modeling, where each subsequence contains the symbols associated with a particular probability from the context model. In another example, variable-to-variable coding with a primary codeset and a secondary codeset can improve coding efficiency. The secondary codeset is used only during "end" or "flush" events, where a sequence or subsequence of symbols does not complete a primary codeword. The subsequences of symbols associated with particular probabilities defined in the context model may be considered as being produced by different "sources".

Nevertheless, there are still certain drawbacks to binary entropy encoding that can arise in certain circumstances. For example, in the context of parallel encoding the output bitstream may include overhead information about the length of each of the encoded subsequences. For a context model having a large number of "sources", i.e. probabilities, this can mean a sizable overhead. In the context of two-codeset variable-to-variable encoding, the use of the less-efficient secondary codeset can be costly, particular where there are a large number of "sources" and, thus, a large number of partial subsequences that need to be encoded using secondary codewords after a flush event.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

The present application describes architectures, methods and processes for encoding and decoding data.

In one aspect, the present application describes a method for encoding an input sequence of symbols, the symbols belonging to a finite alphabet, wherein a context model specifies a predefined probability set, and wherein each symbol of the input sequence of symbols is associated with a probability from the predefined probability set on the basis of the context model. The method includes selecting a new probability set, wherein the new probability set is not identical to the predefined probability set; assigning each of the symbols of the input sequence a respective probability from the new probability set based upon a mapping, wherein the mapping maps each of the probabilities of the predefined probability set to a respective one of the probabilities from the new probability set; and entropy encoding the input sequence of symbols, wherein the entropy encoding includes grouping symbols on the basis of their respective assigned probabilities from the new probability set.

In another aspect, the present application describes a method for decoding an encoded bitstream to obtain a sequence of symbols, the symbols belonging to a finite alphabet, wherein a context model specifies a predefined probability set, and wherein each symbol of the sequence of symbols is associated with a probability from the predefined probability set on the basis of the context model. The method includes reading, from the bitstream, information identifying a new probability set, wherein the new probability set is not identical to the predefined probability set; assigning, to each of the symbols of the sequence of symbols, a respective probability from the new probability set based upon a mapping, wherein the mapping maps each of the probabilities of the predefined probability set to a respective one of the probabilities from the new probability set; and entropy decoding the encoded bitstream on the basis of their respective assigned probabilities from the new probability set.

In yet another aspect, the present application describes an encoder having a memory, processor, and encoding application executable by the processor that, when executed, configures the processor to perform one of the encoding processes described herein.

In yet a further aspect, the present application describes a decoder having a memory, processor, and decoding application executable by the processor that, when executed, configures the processor to perform one of the decoding processes described herein.

In another aspect, the present application describes a tangible computer-readable medium storing computer-executable instructions which, when executed, configure a processor to perform one of the encoding or decoding processes described herein.

It will be understood that the reference herein to a processor is not limited to a single processor computer architecture and can include multi-core processors, multiple processors, and distributed architectures, in some embodiments.

Other aspects and features of the present application will be understood by those of ordinary skill in the art from a review of the following description of examples in conjunction with the accompanying figures.

The following description relates to data compression in general and, in particular, to the encoding of finite alphabet sources, such as a binary source. In many of the examples given below, particular applications of such an encoding and decoding scheme are given. For example, many of the illustrations below make reference to video coding. It will be appreciated that the present application is not limited to video coding or image coding.

In the description that follows, example embodiments are described with reference to the H.264 standard. Those ordinarily skilled in the art will understand that the present application is not limited to H.264 but may be applicable to other video coding/decoding standards. It will also be appreciated that the present application is not necessarily limited to video coding/decoding and may be applicable to coding/decoding of any binary sources.

In the description that follows, in the context of video applications the terms frame and slice are used somewhat interchangeably. Those of skill in the art will appreciate that, in the case of the H.264 standard, a frame may contain one or more slices. It will also be appreciated that certain encoding/decoding operations are performed on a frame-by-frame basis and some are performed on a slice-by-slice basis, depending on the particular requirements of the applicable video coding standard. In any particular embodiment, the applicable video coding standard may determine whether the operations described below are performed in connection with frames and/or slices, as the case may be. Accordingly, those ordinarily skilled in the art will understand, in light of the present disclosure, whether particular operations or processes described herein and particular references to frames, slices, or both are applicable to frames, slices, or both for a given embodiment.

Figure 1:
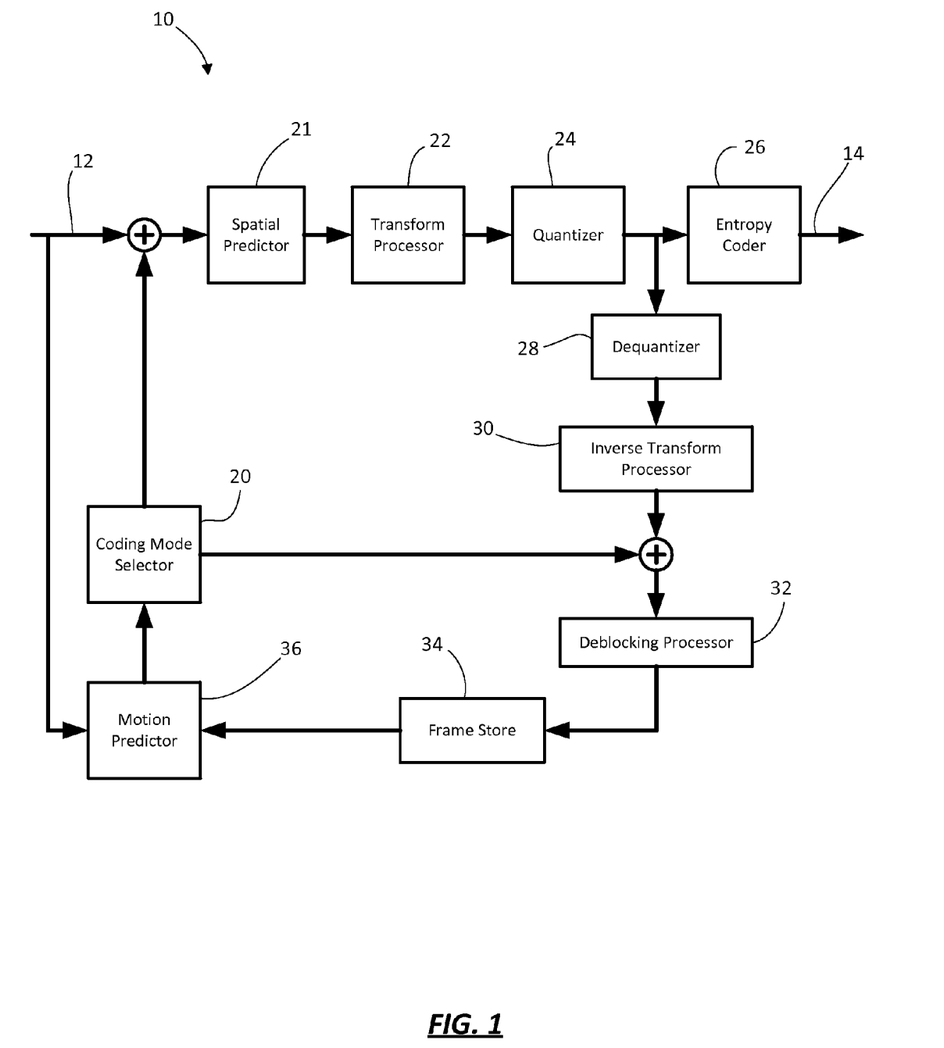
FIG. 1 shows, in block diagram form, an encoder for encoding video.
Figure 2:
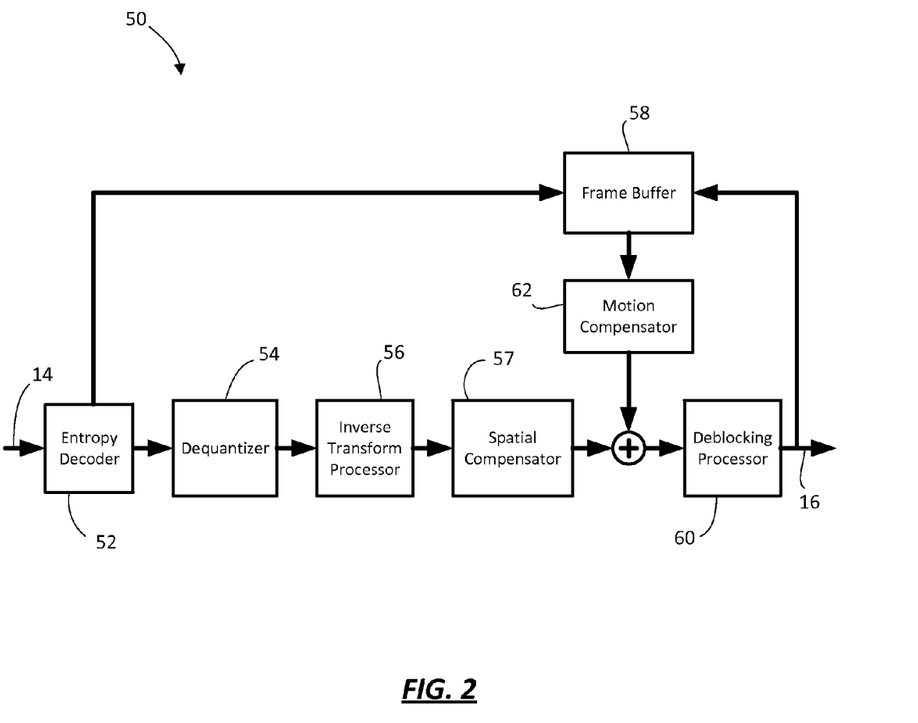
FIG. 2 shows, in block diagram form, a decoder for decoding video.

Reference is now made to FIG. 1, which shows, in block diagram form, an encoder 10 for encoding video. Reference is also made to FIG. 2, which shows a block diagram of a decoder 50 for decoding video. It will be appreciated that the encoder 10 and decoder 50 described herein may each be implemented on an application-specific or general purpose computing device, containing one or more processing elements and memory. The operations performed by the encoder 10 or decoder 50, as the case may be, may be implemented by way of application-specific integrated circuit, for example, or by way of stored program instructions executable by a general purpose processor. The device may include additional software, including, for example, an operating system for controlling basic device functions. The range of devices and platforms within which the encoder 10 or decoder 50 may be implemented will be appreciated by those ordinarily skilled in the art having regard to the following description.

The encoder 10 receives a video source 12 and produces an encoded bitstream 14. The decoder 50 receives the encoded bitstream 14 and outputs a decoded video frame 16. The encoder 10 and decoder 50 may be configured to operate in conformance with a number of video compression standards. For example, the encoder 10 and decoder 50 may be H.264/AVC compliant. In other embodiments, the encoder 10 and decoder 50 may conform to other video compression standards, including evolutions of the H.264/AVC standard.

The encoder 10 includes a spatial predictor 21, a coding mode selector 20, transform processor 22, quantizer 24, and entropy coder 26. As will be appreciated by those ordinarily skilled in the art, the coding mode selector 20 determines the appropriate coding mode for the video source, for example whether the subject frame/slice is of I, P, or B type, and whether particular macroblocks within the frame/slice are inter or intra coded. The transform processor 22 performs a transform upon the spatial domain data. In particular, the transform processor 22 applies a block-based transform to convert spatial domain data to spectral components. For example, in many embodiments a discrete cosine transform (DCT) is used. Other transforms, such as a discrete sine transform or others may be used in some instances. Applying the block-based transform to a block of pixel data results in a set of transform domain coefficients. The set of transform domain coefficients is quantized by the quantizer 24. The quantized coefficients and associated information, such as motion vectors, quantization parameters, etc., are then encoded by the entropy coder 26.

Intra-coded frames/slices (i.e. type I) are encoded without reference to other frames/slices. In other words, they do not employ temporal prediction. However intra-coded frames do rely upon spatial prediction within the frame/slice, as illustrated in FIG. 1 by the spatial predictor 21. That is, when encoding a particular block the data in the block may be compared to the data of nearby pixels within blocks already encoded for that frame/slice. Using a prediction algorithm, the source data of the block may be converted to residual data. The transform processor 22 then encodes the residual data. H.264, for example, prescribes nine spatial prediction modes for 4×4 transform blocks. In some embodiments, each of the nine modes may be used to independently process a block, and then rate-distortion optimization is used to select the best mode.

The H.264 standard also prescribes the use of motion prediction/compensation to take advantage of temporal prediction. Accordingly, the encoder 10 has a feedback loop that includes a de-quantizer 28, inverse transform processor 30, and deblocking processor 32. These elements mirror the decoding process implemented by the decoder 50 to reproduce the frame/slice. A frame store 34 is used to store the reproduced frames. In this manner, the motion prediction is based on what will be the reconstructed frames at the decoder 50 and not on the original frames, which may differ from the reconstructed frames due to the lossy compression involved in encoding/decoding. A motion predictor 36 uses the frames/slices stored in the frame store 34 as source frames/slices for comparison to a current frame for the purpose of identifying similar blocks. Accordingly, for macroblocks to which motion prediction is applied, the "source data" which the transform processor 22 encodes is the residual data that comes out of the motion prediction process. The residual data is pixel data that represents the differences (if any) between the reference block and the current block. Information regarding the reference frame and/or motion vector may not be processed by the transform processor 22 and/or quantizer 24, but instead may be supplied to the entropy coder 26 for encoding as part of the bitstream along with the quantized coefficients.

Those ordinarily skilled in the art will appreciate the details and possible variations for implementing H.264 encoders.

The decoder 50 includes an entropy decoder 52, dequantizer 54, inverse transform processor 56, spatial compensator 57, and deblocking processor 60. A frame buffer 58 supplies reconstructed frames for use by a motion compensator 62 in applying motion compensation. The spatial compensator 57 represents the operation of recovering the video data for a particular intra-coded block from a previously decoded block.

The bitstream 14 is received and decoded by the entropy decoder 52 to recover the quantized coefficients. Side information may also be recovered during the entropy decoding process, some of which may be supplied to the motion compensation loop for use in motion compensation, if applicable. For example, the entropy decoder 52 may recover motion vectors and/or reference frame information for inter-coded macroblocks.

The quantized coefficients are then dequantized by the dequantizer 54 to produce the transform domain coefficients, which are then subjected to an inverse transform by the inverse transform processor 56 to recreate the "video data". It will be appreciated that, in some cases, such as with an intra-coded macroblock, the recreated "video data" is the residual data for use in spatial compensation relative to a previously decoded block within the frame. The spatial compensator 57 generates the video data from the residual data and pixel data from a previously decoded block. In other cases, such as inter-coded macroblocks, the recreated "video data" from the inverse transform processor 56 is the residual data for use in motion compensation relative to a reference block from a different frame. Both spatial and motion compensation may be referred to herein as "prediction operations".

The motion compensator 62 locates a reference block within the frame buffer 58 specified for a particular inter-coded macroblock. It does so based on the reference frame information and motion vector specified for the inter-coded macroblock. It then supplies the reference block pixel data for combination with the residual data to arrive at the recreated video data for that macroblock.

A deblocking process may then be applied to a reconstructed frame/slice, as indicated by the deblocking processor 60. After deblocking, the frame/slice is output as the decoded video frame 16, for example for display on a display device. It will be understood that the video playback machine, such as a computer, set-top box, DVD or Blu-Ray player, and/or mobile handheld device, may buffer decoded frames in a memory prior to display on an output device.

Entropy coding is a fundamental part of all lossless and lossy compression schemes, including the video compression described above. The purpose of entropy coding is to represent a presumably decorrelated signal, often modeled by an independent, but not identically distributed process, as a sequence of bits. The technique used to achieve this must not depend on how the decorrelated signal was generated, but may rely upon relevant probability estimations for each upcoming symbol.

There are two common approaches for entropy coding used in practice: the first one is variable-length coding, which identifies input symbols or input sequences by codewords, and the second one is range (or arithmetic) coding, which encapsulates a sequence of subintervals of the [0, 1) interval, to arrive at a single interval, from which the original sequence can be reconstructed using the probability distributions that defined those intervals. Typically, range coding methods tend to offer better compression, while VLC methods have the potential to be faster. In either case, the symbols of the input sequence are from a finite alphabet.

A special case of entropy coding is when the input alphabet is restricted to binary symbols. Here VLC schemes must group input symbols together to have any potential for compression, but since the probability distribution can change after each bit, efficient code construction is difficult. Accordingly, range encoding is considered to have greater compression due to its greater flexibility, but practical applications are hindered by the higher computational requirements of arithmetic codes.

One of the techniques used in some entropy coding schemes, such as CAVLC and CABAC, both of which are used in H.264/AVC, is context modeling. With context modeling, each bit of the input sequence has a context, where the context is given by the bits that preceded it. In a first-order context model, the context may depend entirely upon the previous bit (symbol). In many cases, the context models may be adaptive, such that the probabilities associated with symbols for a given context may change as further bits of the sequence are processed. In yet other cases, such as those described herein, the context model is based on i.i.d. (independent and identically distributed) binary sources, wherein the context model defines a set of probabilities of producing a least probable symbol (LPS), and each bit of the input sequence is assigned one of the probabilities from the set. The bits associated with a given one of the probabilities are considered to be a sequence of symbols produced by an i.i.d. source.

Figure 3:
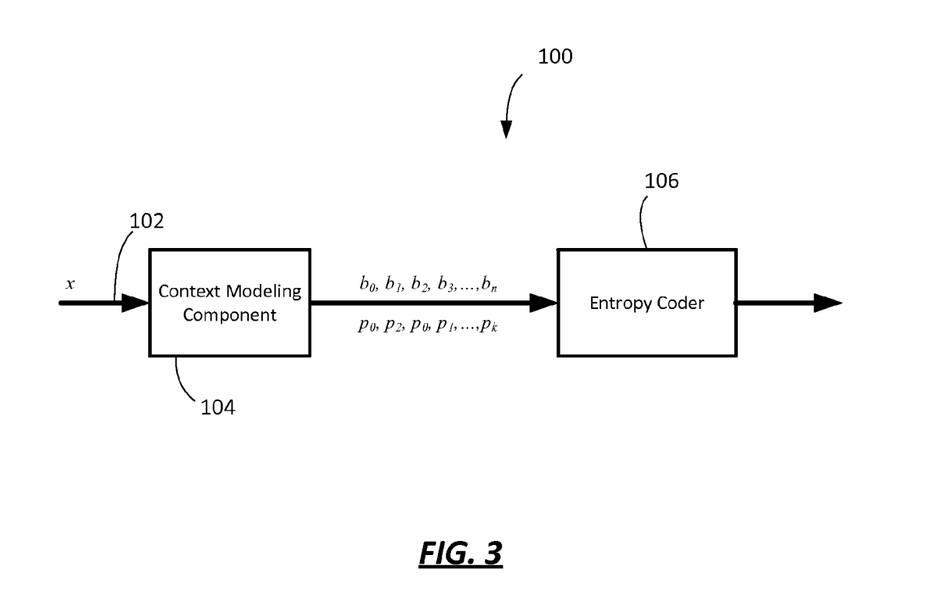
FIG. 3 shows a block diagram of an encoding process.

Reference is made to FIG. 3, which shows a block diagram of an encoding process 100. The encoding process 100 includes a context modeling component 104 and an entropy coder 108. The context modeling component 104 receives the input sequence x 102, which in this example is a bit sequence $(b_0, b_1, \ldots, b_n)$. The context modeling component 104 determines a context for each bit $b_i$ based on one or more previous bits in the sequence, and determines, based on the adaptive context model, a probability $p_i$ associated with that bit $b_i$, where the probability is the probability that the bit will be the Least Probable Symbol (LPS). The LPS may be "0" or "1" in a binary embodiment, depending on the convention or application. The context modeling component outputs the input sequence, i.e. the bits $(b_0, b_1, \ldots, b_n)$ along with their respective probabilities $(p_0, p_1, \ldots, p_n)$. The probabilities are an estimated probability determined by the context model. This data is then input to the entropy coder 106, which encodes the input sequence using the probability information. For example, the entropy coder 106 may be a binary arithmetic coder. The entropy coder 106 outputs a bitstream 108 of encoded data.

It will be appreciated each bit of the input sequence is processed serially to update the context model, and the serial bits and probability information are supplied to the entropy coder 106, which then entropy codes the bits to create the bitstream 108. Those ordinarily skilled in the art will appreciate that, in some embodiments, explicit probability information may not be passed from the context modeling component 104 to the entropy coder 106; rather, in some instances, for each bit the context modeling component 104 may send the entropy coder 106 an index or other indicator that reflects the probability estimation made be the context modeling component 104 based on the context model and the current context of the input sequence 102. The index or other indicator is indicative of the probability estimate associated with its corresponding bit.

In U.S. patent application Ser. No. 12/713,613, filed Feb. 26, 2010, and owned in common herewith, a process and devices were described for encoding an input sequence using dual codesets. The primary codeset efficiently encoded the input sequence in a buffer-based encoding process. When a flush event occurred, for example due to end-of-frame, end of group-of-pictures, etc., secondary codewords from a secondary codeset were used to encode the partial subsequences associated with each probability defined by the context model. The contents of U.S. patent application Ser. No. 12/713,613 are incorporated herein by reference.

In U.S. patent application Ser. No. 12/707,797, filed Feb. 18, 2010, and owned in common herewith, methods and devices for parallel entropy coding are described. In one example, an input sequence is de-multiplexed into subsequences based on the associated probability of each input symbol (e.g. bit). The subsequences are each encoded by a respective one of the parallel entropy encoders. In similar manner at the decoder, the encoded bitstream is separated into encoded subsequences, which are each decoded by a respective one of the parallel decoders. The encoded bitstream may include overhead information regarding the length of each of the encoded subsequences to allow the decoder to separate them for parallel decoding. The contents of U.S. patent application Ser. No. 12/707,797 are incorporated herein by reference.

In both of these applications, the input sequence is first evaluated using the applicable context model to assign a probability to each input symbol, where the assigned probability is one of a predefined set of probabilities specified by the context model. In some instances, the number of probabilities can result in inefficiencies, either in the use of a large number of secondary codewords due to a flush event, or in the need to send a large amount of overhead specifying the length of each encoded subsequence for each probability value (or index). Each subsequence associated with each of the probabilities may be considered as originating from a "source" as that term is used herein.

In accordance with one aspect, the present application proposes an encoder and decoder in which a new probability set is selected for the purposes of entropy encoding and decoding. The context modeling occurs as before using the predefined probability set associated with the context model; however, prior to entropy encoding and decoding, a new probability set is selected. A mapping defines the relationship between the predefined probability set and the new probability set. Each symbol that has been assigned a probability from the predefined probability set by the context model is then re-assigned or mapped to a new probability selected from the new probability set based on the mapping.

The symbols are then binary entropy encoded using the new probabilities. In many embodiments, there are fewer new probabilities than predefined probabilities. In other words, the new probability set is smaller than the predefined probability set. In some instances, the new probability set is a subset of the probabilities in the predefined probability set, but not necessarily. With fewer probabilities, there are fewer subsequences, and thus less overhead and/or fewer secondary codewords. Accordingly, conceptually by using fewer probabilities we are allowing for fewer "sources". Each of the "sources" is still considered to be producing a random sequence of symbols as an i.i.d. binary source.

Provided the loss of efficiency in merging symbols from more than one of the predefined probabilities into a single new probability is offset by the gain in reduced overhead or fewer secondary codewords, then the mapping improves the efficiency of the encoder and/or decoder.

To illustrate one example embodiment, consider a finite number of probability sets $P_0, P_1, \ldots, P_{K-1}$, where $P_0 = P$. For each $P_k$, we define a mapping $T_k: P \to P_k$ by the following rule:

$$T_k(p) = \mathop{\mathrm{argmin}}_{q \in P_k} \left[ p \log \frac{p}{q} + (1-p) \log \frac{(1-p)}{(1-q)} \right]$$

We denote $R(p,q) = p \log(p/q) + (1-p) \log[(1-p)/(1-q)]$. It will be understood that the quantity $R(p,q)$ is a measure of relative entropy. It will be noted that the mapping expression for $T_k(p)$ results in mapping each probability p of the probability set P to a probability q of the new probability set $P_k$ on the basis that the selection of probability q minimizes the relative entropy expression.

In one embodiment, the $T_k$ mappings are computed by the following algorithm, which for any probability set $P_k$ runs in O(N) time, provided that the sets P and $P_k$ are sorted according to decreasing probability:

1. Let i=0, j=0, p=P[0].
2. If i==N, the algorithm terminates.
3. While j<|$P_k$|-1 and $P_k$[j]>=p, set j=j+1
4. If j==0 or R(p, $P_k$[j])<R(p, $P_k$[j-1]), set $T_k$(p)=$P_k$[j]. Otherwise, set $T_k$(p)=$P_k$[j-1].
5. Let i=i+1, p=P[i] and go to 2.

In the off-line setting, the probability sets and mappings are known to both the encoder and the decoder. In the on-line setting, the sets and the mappings between them are updated on the run, optionally adaptively based on the input data.

In the description below various example embodiments are described. The examples vary in how the probability set is selected. As a general rule, each variation introduces some overhead to the encoded sequences. This overhead may be taken into account when finding the best probability set for encoding. It will be appreciated that the underlying entropy coding method may incur some overhead on its own. For the purposes of this description the encoded sequences may be regarded as inseparable, their overhead included, and we discuss only the overhead for this framework. As a consequence for this discussion we may not use the entropy to compute the sequence lengths, but use the actual encoded length, or at least a reliable upper bound.

Offline Solution

In one exemplary application, the probability sets and mappings may be determined off-line (prior to both the encoding and decoding process, thereby not affecting encoding and decoding times). In one embodiment, the encoding process can be described as follows:

For each k=0, ..., K-1, the entropy coder encodes the N sources using the probability mappings $T_k(p_j)$ for $p_j \in P$. That is, instead of using the probability $p_j$ for source j, the output of source j will be merged into the output of the source with probability $T_k(p_j)$, and the interleaved output of all such sources are encoded with probability $T_k(p_j)$. For index k this results in |$P_k$| encoded sequences of total length $L_k$. The encoder then picks index m that minimizes $L_k$ (k=0, ..., K-1), writes C(m) into the output, followed by the encoded sequences for mapping m (the definition of the prefix code C( ) is described in U.S. patent application Ser. No. 12/707, 797). The overhead in this example is |C(m)|.

If the number K of candidate sets is low, choosing the best one can be done by an exhaustive search, that is, trying out each of $P_0, \ldots, P_{K-1}$. This increases encoding computational complexity, but it does not affect the decoder. If the number of candidate sets is too high for an exhaustive linear search, we may use a heuristic search, such as a search based on gradients evaluated from neighbouring encoded length values.

The decoder reads out the value of m from the decoded file, after which the probability value $T_m(p_j)$ is used instead of $p_j \in P$ for the sources $P_m$ instead of P. That is, whenever the decoder needs to determine a symbol from source j, it looks up the source j' to which j is mapped based on $P_m$ and $T_m$, then decodes the next bit from the encoded data for j' using probability $T_m(p_j)$.

One embodiment of the present application may be illustrated by way of the following example. Let P be the probability values defined for CABAC: $p_k = 0.5\alpha^k$ for k=0, ..., 63, $\alpha = (2*0.01875)^{1/63}$. Let $P_0 = P = \{p_k | k=0, \ldots, 63\}$, and for k=0, ..., 9:

$P_k = \{p_0, p_k, p_{2k}, \ldots, p_{[63/k]k}\} \cup \{p_{63}\}$.

This creates ten probability sets, each of them the subset of P, and with decreasing size, evenly distributed probability values, but retaining the original range ($p_0$ to $p_{63}$). Since the size of $P_k$ is smaller than the size of $P_0$, the overhead associated to encoding with $P_k$ is also smaller, but the encoded length may be higher. The proposed encoder encodes the input symbols with each of $P_0, \ldots, P_9$, and chooses the one that gives the shortest (overhead+payload) length.

Online Solution with Fixed Source Probabilities and Dynamic Probability Sets

In another exemplary application, the probability sets and/or the mappings may be determined online, i.e. dynamically. Thus for video encoding the sets and mappings may be different for different slices or frames or groups of frames (GOPs). As opposed to the offline solution outlined above, here we have to specify how to determine the sets $P_1, \ldots, P_{K-1}$ and how to inform the decoder about the mappings $T_m(p_j)$.

Choosing the candidate sets $P_1, \ldots, P_{K-1}$ may be done based on probabilities, so that the most frequent values are collected in each set (see the example below). Once these sets are known, the mappings $T_k$ are determined with the algorithm above, and the best candidate m is selected using the methods described above in the offline example. After this, the encoder may write $C(|P_m|)$, $C(P_m(0))$, $C(P_m(1))$, ..., $C(P_m(|P_m|-1))$ into the encoded file, followed by the encoded sequences. We note that a probability is encoded by its index in P. For example, if $P_m(0)=0.4$, and P={0.5, 0.4, 0.3, ... }, then C(Pm(0)) is analogous to C(1). The overhead of this variation is $|C(|P_m|)|+|C(P_m(0))|+\ldots+|C(P_m(|P_m|-1))|$. This also means that for this exemplary application the set $P_k$ is a subset of P.

The decoder reads the number of merged sources from the file, followed by their probability indices, and from this it reconstructs $P_m$. Then it computes the mapping $T_m$.

One example embodiment may be illustrated by way of the following example. Let P be the probability values defined for CABAC: $p_k=0.5\alpha^k$ for $k=0, \ldots, 63$, $\alpha=(2*0.01875)^{1/63}$. For each slice or each frame or each GOP, let $P_k$ denote the subset of P consisting of the (64-k) most frequently used probabilities in P for the current slice or frame, where $k=0, 1, \ldots, 63$. The mappings $T_k: P \rightarrow P_k$ are determined by the algorithm above.

In this example, we have 64 probability sets. Assuming that a fixed length code is used to communicate $P_k$ to the decoder, we find the index number m at which the overhead of using $P_m$ is the smallest among the 64 candidate choices $k=0, 1, \ldots, 63$.

Online Solution with Adaptive Source Probabilities and Static Probability Sets

In another exemplary application, the probability values of P are not known in advance, but rather calculated empirically from the observed data. The context model separates the input symbols into different source buffers, and the source probability is estimated as (number of ones in buffer)/(number of symbols in buffer) for each source. We denote the empirical probabilities by $Q=\{q_0, \ldots, q_{N-1}\}$. Then, for the fixed $P_0, \ldots, P_{K-1}$ probability sets, the encoder first determines the mappings between $P_k$ and Q, then finds the one $P_m$ that gives the smallest encoded length $L_m$, based on either an exhaustive or heuristical search, as explained above.

Since Q is in general different from P, the actual mappings $T_k(q_j)$ may differ from the static mappings $T_k(p_j)$, which are known to both the encoder and decoder. Since the decoder needs $T_k(p_j)$, these must be transmitted. In one application, the encoder may just include $C(T_m(q_0))$, $C(T_m(q_1))$, $C(T_m(q_{N-1}))$ in the overhead, as was described above. However, we point out that the correlation between the two mappings is usually high. Therefore, in another embodiment, the encoder transmits $T_m(q_j)$ with a run-length scheme based on the known mappings $T_m(p_j)$. In one example, this may work as follows: first, set M to 0. Let j be the first index from M for which $T_m(q_{M+j}) \neq T_m(p_{M+j})$, or j=N−M if all of them are equal. Then encode C(j), and if j<N−M, encode $C(T_m(q_{M+j}))$ as well. Then set M to j+1, and if M<N, repeat the procedure, otherwise stop. The overhead of this variation is $|C(m)|+|C(j_1)|+|C(T_m(q_{j1}))|+|C(j_2)|+|C(T_m(q_{j2}))|+\ldots+|C(j_r)|$.

To illustrate by way of an example, let P={0.5, 0.4, 0.3, 0.25, 0.2, 0.15, 0.12, 0.10}, and $P_m$={0.5, 0.32, 0.18, 0.12}. Then the mapping algorithm gives $T_m(0.5)=0.5$, $T_m(0.4)=0.32$, $T_m(0.3)=0.32$, $T_m(0.25)=0.32$, $T_m(0.2)=0.18$, $T_m(0.15)=0.18$, $T_m(0.12)=0.12$ and $T_m(0.10)=0.12$. Suppose that the empirical probabilities are Q={0.48, 0.45, 0.31, 0.20, 0.18, 0.26, 0.08, 0.12}. Then the actual mapping, by the same algorithm, is $T_m(0.48)=0.5$, $T_m(0.45)=0.5$, $T_m(0.31)=0.32$, $T_m(0.20)=0.18$, $T_m(0.18)=0.18$, $T_m(0.26)=0.32$, $T_m(0.08)=0.12$ and $T_m(0.12)=0.12$. Then the run-length sequence is (1, 0.5), (1, 0.18), (1, 0.32), (2). For prefix encoding the probability values are represented by their indices in $P_m$: 0.5 is 0, 0.32 is 1, 0.18 is 2, 0.12 is 3. The encoded header is therefore C(m), C(1), C(0), C(1), C(2), C(1), C(1), C(2).

Online Solution with Adaptive Source Probabilities and Dynamic Probability Sets

In another exemplary application, the probability values Q are calculated from the observed data, as described immediately above, and the probability sets $P_1, \ldots, P_{K-1}$ are determined dynamically. Hence, first the empirical probabilities Q are determined from the (number of ones in buffer)/(number of symbols in buffer) for each source. From this point, this variation follows the one given above: first the candidate sets $P_0, \ldots, P_{K-1}$ are determined (where $P_0$ is the predetermined probability set and $P_1, \ldots P_{K-1}$ are the dynamically determined probability sets), the mappings $T_k$ are computed, and the best candidate m is selected using the methods described above. After this, the encoder writes $C(|P_m|)$, $C(P_m(0))$, $C(P_m(1))$, $C(P_m(|P_m|-1))$ into the encoded file, followed by the actual mapping $T_m(q_j)$, followed by the encoded sequences. The overhead of this variation is $|C(|P_m|)|+|C(P_m(0))|+\ldots+|C(P_m(|P_m|-1))|+|C(j_1)|+|C(T_m(q_{j1}))|+|C(j_2)|+|C(T_m(q_{j2}))|+\ldots+|C(j_r)|$. In this specific example, it is presumed that $P_k$ is a subset of P. The actual mapping may be written into the overhead in the same manner as described above. For example, run-length coding is an option.

The decoder first reads the number of merged sources from the encoded file, then the merged source probabilities indexed by elements of P, as given by $C(P_m(0)), \ldots, C(P_m(|P_m|-1))$. After this, the decoder can compute the mapping $T_m(p_j)$ between P and $P_m$. Using this mapping and the run-length coded actual mapping, it then proceeds to compute the actual mapping $T_m(q_j)$. Once ready, it can start decoding the sequences, decoding from the buffer of $T_m(q_j)$ any time a request for a new symbol is made from source j.

The selection of the probability set to use from amongst a number of possible candidate probability sets may be application dependent. In some instances, the mapping for each of the candidate sets may be predefined and known. In some instances, the mapping may be determined dynamically, particularly if there are a large number of candidate probability sets.

To select the probability set to use for a given video, frame, etc., in one embodiment each of the candidates may be tested by using that set to encode the data and the optimal probability set selected based on the testing. This is the brute force approach.

In another embodiment, the selection may be based on the data type or characteristics. For example, one or more particular candidate probabilities sets may be designated for I or P frames, whereas a different candidate probability set or sets may be designated for B frames. Yet other characteristics of the video data may used as the basis for determining the candidate set or sets.

In yet another embodiment, as described above, the selection may be based on an actual distribution of bits amongst the predefined probabilities, i.e. the statistics for the actual data, for example for the frame, etc. For example, any probabilities that have no bits assigned may dropped; or any probabilities having few bits may be merged with neighbouring probabilities.

In one embodiment, the dynamic merging or consolidation of predetermined probabilities based on actual data statistics may be based upon obtaining approximately the same number of bits for each probability, i.e. balancing.

In yet another embodiment, empirical probability data may be used to dynamically determine the mapping as opposed to the predefined probabilities, since in some instances (particularly at higher order indices) the actual probability statistics may vary considerably from the probabilities predicted by the context model.

Figure 4:
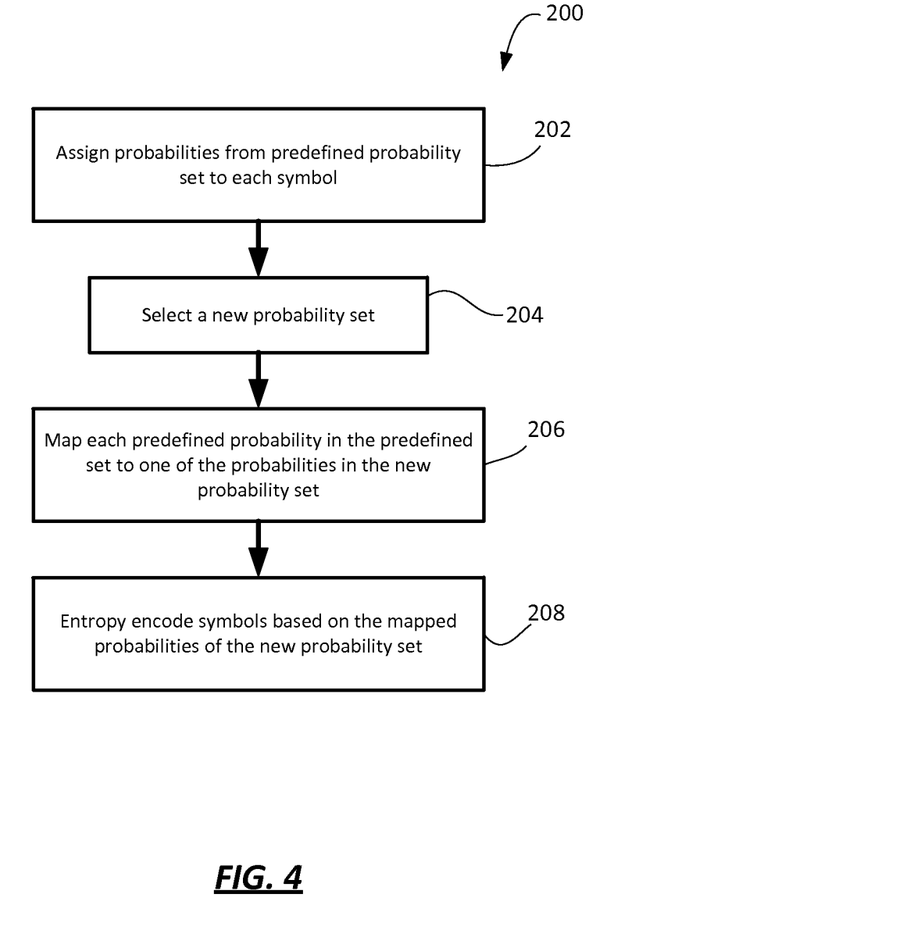
FIG. 4 shows, in flowchart form, a method of encoding input symbols using a new set of probabilities and a mapping.

Reference is now made to FIG. 4, which shows, in flowchart form, one example process 200 for encoding an input sequence by reducing sources. The process 200 begins in operation 202 with application of the context model. In particular, each symbol of the input sequence is processed and assigned an estimated probability. The estimated probability is selected from a defined probability set using the context of the symbol and the context model. As described above, the defined probability set may be predefined and associated with the context model. An example is the 64 states defined in CABAC.

In operation 204, a new probability set is selected. In a simple embodiment, this may mean selecting the sole candidate new probability set. In other embodiments, this operation may involve testing candidate probability sets to see which of them results in the shortest overall length of encoded sequences. In some instances, this operation may involve dynamically generating a new candidate probability set based on actual statistics from the input sequence, as described above.

Operation 206 involves defining or generating the mapping between the predefined probability set and the new probability set. It will be understood that the mapping may be predetermined and stored if the candidate probability sets and the predetermined probability set are predetermined. It will also be understood that the mapping operation may form part of operation 204, i.e. the selection of the new probability set from amongst candidate sets, since a mapping is defined for each candidate set. It will also be appreciated that the mapping means that each symbol that was assigned a probability from the predefined probability set in operation 202 may be assigned a probability from the new probability set based upon the mapping.

The symbols are entropy encoded in operation 208 to produce an encoded bitstream. The entropy encoding is based upon the new probabilities assigned in operation 206. In other words, the entropy encoding is based upon the new, and in many embodiments reduced-size, probability set.

Figure 5:
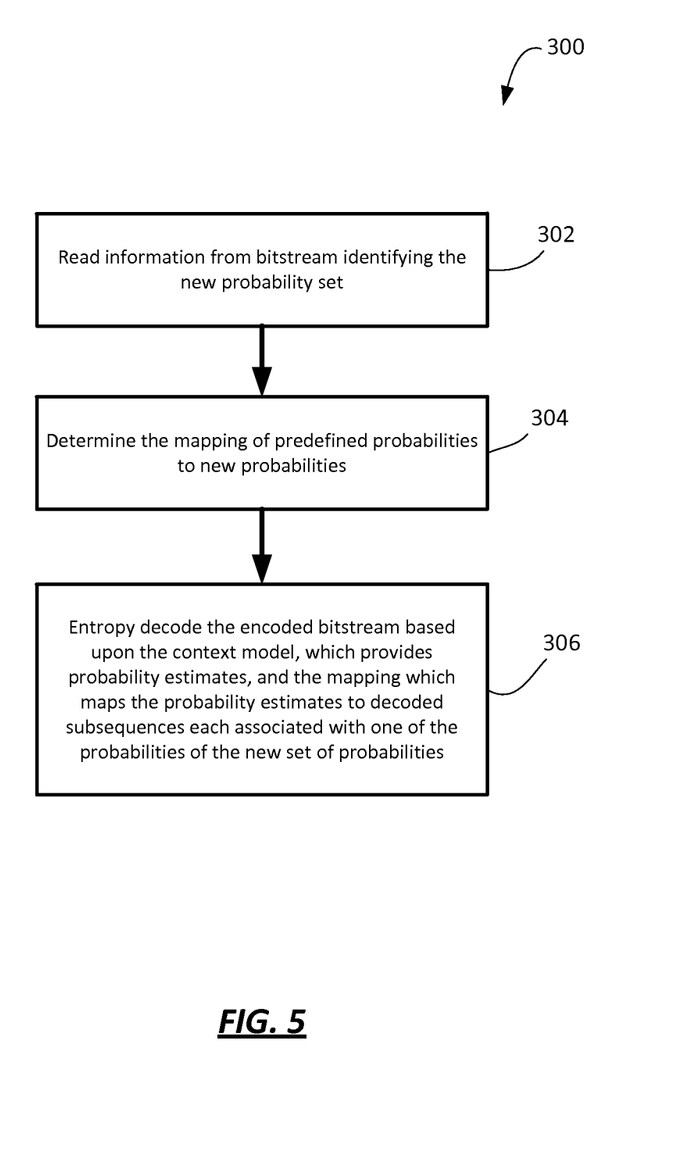
FIG. 5 shows, in flowchart form, a method of decoding an encoded bitstream based upon a new set of probabilities and a mapping.

FIG. 5 shows, in flowchart form, a process 300 for decoding an encoded bitstream in accordance with the present application. The process 300 begins in operation 302 with reading information from the bitstream regarding the new probability set. As described above, in some embodiments, this information may simply indicate the selection of one of a plurality of predefined candidate probability sets already known to the decoder. In some embodiments, this information may identify particular probabilities from the predefined probability set that are included in the new probability set, i.e. the information may define or identify a subset of the predefined probability set. In yet other embodiments, this information may provide explicit probability information. In all embodiments, through operation 302 the decoder obtains the new probability set.

Operation 304 includes determining the mapping between the new probability set and the predetermined probability set. The mapping may be predefined such that operation 304 involves retrieving the predefined mapping from memory or other storage. In some embodiments, the mapping may be specified in the bitstream and the decoder may read the mapping from the bitstream. In yet other embodiments, the mapping may be generated by the decoder, for example using the relative entropy algorithm described herein.

In operation 306, the encoded bitstream is entropy decoded. Entropy decoding includes obtaining decoded subsequences, where each decoded subsequence is associated with a probability from the new set of probabilities. The entropy decoding in operation 306 is based upon the context model, which provides a probability estimate for each symbol, and the mapping, which maps the probability estimate to its corresponding probability from the new set of probabilities and, thus, to one of the decoded subsequences.

Figure 6:
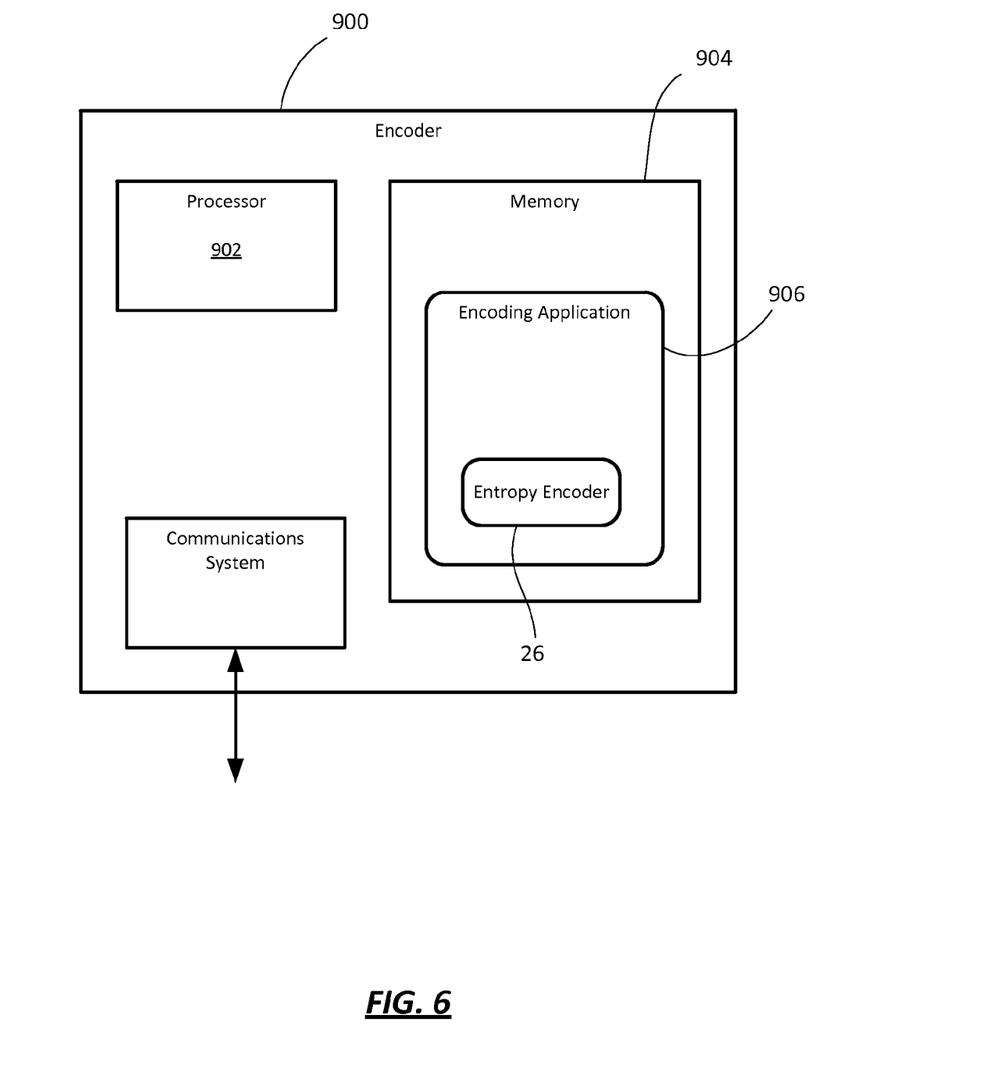
FIG. 6 shows a simplified block diagram of an example embodiment of an encoder.

Reference now made to FIG. 6, which shows a simplified block diagram of an example embodiment of an encoder 900. The encoder 900 includes a processor 902, memory 904, and an encoding application 906. The encoding application 906 may include a computer program or application stored in memory 904 and containing instructions for configuring the processor 902 to perform steps or operations such as those described herein. For example, the encoding application 906 may encode and output video bitstreams encoded in accordance with the probability mapping encoding process described herein. The encoding application 906 may include an entropy encoder 26 configured to entropy encode input sequences and output a bitstream using one or more of the processes described herein. It will be understood that the encoding application 906 may be stored in on a computer readable medium, such as a compact disc, flash memory device, random access memory, hard drive, etc.

In some embodiments, the processor 902 in the encoder 900 may be a single processing unit configured to implement the instructions of the encoding application 906. In some other embodiments, the processor 902 may include more than one processing unit capable of executing instructions in parallel. The multiple processing units may be logically or physically separate processing units. In some instances, the encoder 900 may include N or more processing units, wherein N of the processing units are configured by the encoding application 906 to operate as parallel entropy coders for implementing the methods described herein. It will further be appreciated that in some instances, some or all operations of the encoding application 906 and one or more processing units may be implemented by way of application-specific integrated circuit (ASIC), etc.

Figure 7:
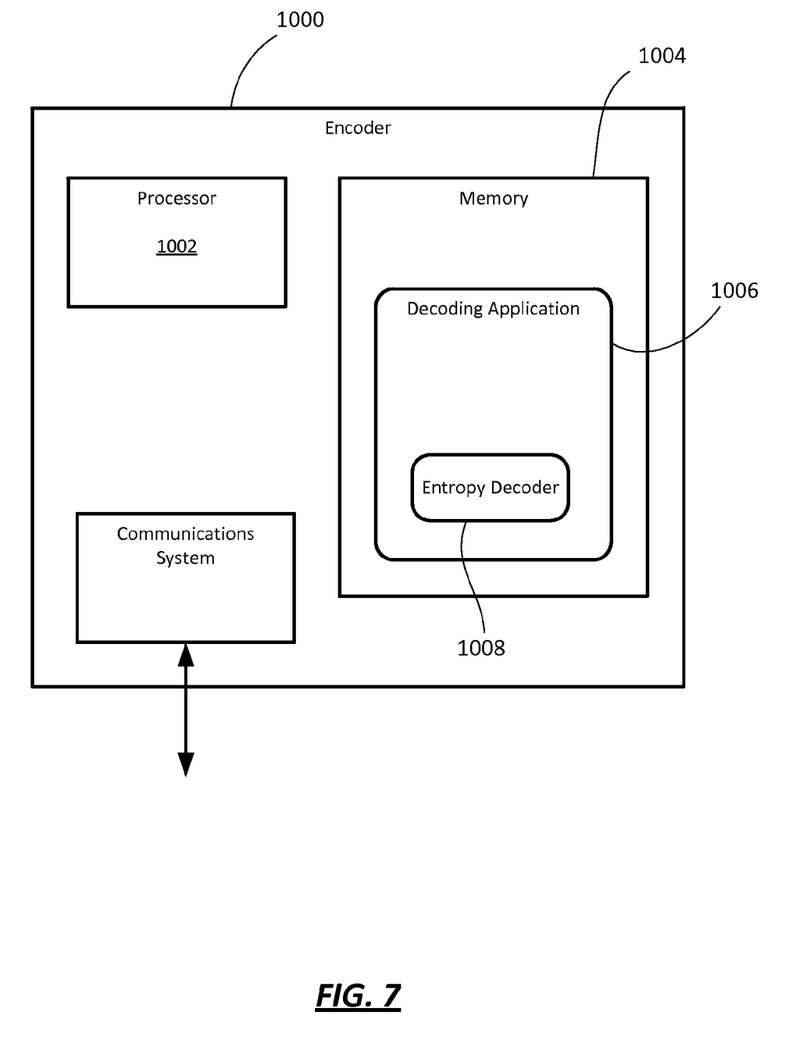
FIG. 7 shows a simplified block diagram of an example embodiment of a decoder.

Reference is now also made to FIG. 7, which shows a simplified block diagram of an example embodiment of a decoder 1000. The decoder 1000 includes a processor 1002, a memory 1004, and a decoding application 1006. The decoding application 1006 may include a computer program or application stored in memory 1004 and containing instructions for configuring the processor 1002 to perform steps or operations such as those described herein. The decoding application 1006 may include an entropy decoder 1008 configured to receive a bitstream encoded in accordance with the probability mapping entropy encoding process described herein, and to extract encoded subsequences from the bitstream and decode them in using mapped probabilities. The decoding application 1006 may configure the processor to decode the encoded subsequences in parallel to produce parallel decoded sequences and to interleave the symbols of the decode sequences to produce a reconstructed sequences. It will be understood that the decoding application 1006 may be stored in on a computer readable medium, such as a compact disc, flash memory device, random access memory, hard drive, etc.

In some embodiments, the processor 1002 in the decoder 1000 may be a single processing unit configured to implement the instructions of the decoding application 1006. In some other embodiments, the processor 1002 may include more than one processing unit capable of executing instructions in parallel. The multiple processing units may be logically or physically separate processing units. In some instances, the decoder 1000 may include d, N or more or fewer processing units, wherein the processing units are configured by the decoding application 1006 to operate as parallel entropy decoders for implementing the methods described herein. It will further be appreciated that in some instances, some or all operations of the decoding application 1006 and one or more processing units may be implemented by way of application-specific integrated circuit (ASIC), etc.

It will be appreciated that the decoder and/or encoder according to the present application may be implemented in a number of computing devices, including, without limitation, servers, suitably programmed general purpose computers, set-top television boxes, television broadcast equipment, and mobile devices. The decoder or encoder may be implemented by way of software containing instructions for configuring a processor to carry out the functions described herein. The software instructions may be stored on any suitable tangible computer-readable medium or memory, including CDs, RAM, ROM, Flash memory, etc.

It will be understood that the encoder and decoder described herein and the module, routine, process, thread, or other software component implementing the described method/process for configuring the encoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A method for encoding an input sequence of symbols, the symbols belonging to a finite alphabet, wherein a context model specifies a predefined probability set, and wherein each symbol of the input sequence of symbols is associated with a probability from the predefined probability set on the basis of the context model, the method comprising:

selecting a new probability set, wherein the new probability set is not identical to the predefined probability set;

assigning each of the symbols of the input sequence a respective probability from the new probability set based upon a mapping, wherein the mapping maps each of the probabilities of the predefined probability set to a respective one of the probabilities from the new probability set; and entropy encoding the input sequence of symbols, wherein the entropy encoding includes grouping symbols on the basis of their respective assigned probabilities from the new probability set.

2. The method claimed in claim 1, wherein the new probability set is a subset of the predefined probability set.

3. The method claimed in claim 2, wherein assigning each of the symbols includes defining the mapping by determining, for each probability of the predefined probability set, to which one of the probabilities from the new probability set it is mapped.

4. The method claimed in claim 3, wherein determining is based on selecting the one of the probabilities from the new probability set that minimizes a relative entropy expression.

5. The method claimed in claim 1, wherein selecting the new probability set comprises selecting the new probability set from amongst a plurality of predetermined candidate probability sets.

6. The method claimed in claim 5, wherein entropy encoding includes including information regarding the selected new probability set in a header.

7. The method claimed in claim 1, wherein selecting the new probability set comprises generating a set of candidate probability sets based on the most frequently occurring probabilities from the predefined probability set in the input sequence, and wherein selecting further comprises selecting the new probability set from amongst the set of candidate probability sets.

8. The method claimed in claim 7, wherein selecting the new probability set further comprises dynamically generating the mapping by determining, for each probability of the predefined probability set, to which one of the probabilities from the new probability set it is mapped.

9. The method claimed in claim 7, wherein entropy encoding includes identifying the probabilities in the new probability set within a header.

10. A method for decoding an encoded bitstream to obtain a sequence of symbols, the symbols belonging to a finite alphabet, wherein a context model specifies a predefined probability set, and wherein each symbol of the sequence of symbols is associated with a probability from the predefined probability set on the basis of the context model, the method comprising:

reading, from the bitstream, information identifying a new probability set, wherein the new probability set is not identical to the predefined probability set;

assigning, to each of the symbols of the sequence of symbols, a respective probability from the new probability set based upon a mapping, wherein the mapping maps each of the probabilities of the predefined probability set to a respective one of the probabilities from the new probability set; and entropy decoding the encoded bitstream on the basis of their respective assigned probabilities from the new probability set.

11. The method claimed in claim 10, wherein the new probability set is a subset of the predefined probability set.

12. The method claimed in claim 11, wherein assigning a respective probability includes defining the mapping by determining, for each probability of the predefined probability set, to which one of the probabilities from the new probability set it is mapped.

13. The method claimed in claim 12, wherein determining is based on selecting the one of the probabilities from the new probability set that minimizes a relative entropy expression.

14. The method claimed in claim 10, wherein the information identifying the new probability set comprises information identifying one of a predefined set of candidate probability sets.

15. The method claimed in claim 10, wherein the information identifying the new probability set specifies the probabilities from the predefined probability set that are included in the new probability set.

16. The method claimed in claim 15, wherein reading further comprises dynamically generating the mapping by determining, for each probability of the predefined probability set, to which one of the probabilities from the new probability set it is mapped based on minimizing a relative entropy expression.

17. An encoder for encoding an input sequence of symbols, the symbols belonging to a finite alphabet, wherein a context model specifies a predefined probability set, and wherein each symbol of the input sequence of symbols is associated with a probability from the predefined probability set on the basis of the context model, the encoder comprising:
a memory storing the input sequence of symbols;
a processor; and
an encoding application executable by the processor and which, when executed, configures the processor to:
select a new probability set, wherein the new probability set is not identical to the predefined probability set,
assign each of the symbols of the input sequence a respective probability from the new probability set based upon a mapping, wherein the mapping maps each of the probabilities of the predefined probability set to a respective one of the probabilities from the new probability set, and
entropy encode the input sequence of symbols, wherein the entropy encoding includes grouping symbols on the basis of their respective assigned probabilities from the new probability set.

18. The encoder claimed in claim 17, wherein the new probability set is a subset of the predefined probability set.

19. The encoder claimed in claim 18, wherein the processor is configured to define the mapping by determining, for each probability of the predefined probability set, to which one of the probabilities from the new probability set it is mapped on the basis of minimizing a relative entropy expression.

20. The encoder claimed in claim 17, wherein the processor is configured to select the new probability set from amongst a plurality of predetermined candidate probability sets.

21. The encoder claimed in claim 17, wherein the processor is configured to select the new probability set by generating a set of candidate probability sets based on the most frequently occurring probabilities from the predefined probability set in the input sequence, and selecting the new probability set from amongst the set of candidate probability sets.

22. A decoder for decoding an encoded bitstream to obtain a sequence of symbols, the symbols belonging to a finite alphabet, wherein a context model specifies a predefined probability set, and wherein each symbol of the sequence of symbols is associated with a probability from the predefined probability set on the basis of the context model, the decoder comprising:
a memory;
a processor;
a decoding application executable by the processor and which, when executed, configures the processor to
read, from the bitstream, information identifying a new probability set, wherein the new probability set is not identical to the predefined probability set;
assign, to each of the symbols of the sequence of symbols, a respective probability from the new probability set based upon a mapping, wherein the mapping maps each of the probabilities of the predefined probability set to a respective one of the probabilities from the new probability set; and
entropy decode the encoded bitstream on the basis of their respective assigned probabilities from the new probability set.

23. The decoder claimed in claim 22, wherein the new probability set is a subset of the predefined probability set.

24. The decoder claimed in claim 23, wherein the processor is configured to define the mapping by determining, for each probability of the predefined probability set, to which one of the probabilities from the new probability set it is mapped based on minimizing a relative entropy expression.

25. The decoder claimed in claim 22, wherein the information identifying the new probability set comprises information identifying one of a predefined set of candidate probability sets.

26. The decoder claimed in claim 22, wherein the information identifying the new probability set specifies the probabilities from the predefined probability set that are included in the new probability set.

27. A non-transitory computer-readable medium storing computer-executable instructions which, when executed by one or more processors, configure the one or more processors to perform the method claimed in claim 1.

28. A non-transitory computer-readable medium storing computer-executable instructions which, when executed by one or more processors, configure the one or more processors to perform the method claimed in claim 10.

* * * * *